United States Patent
Yeh (12) 
(10) Patent No.: US 7,446,604 B2
(45) Date of Patent: *Nov. 4, 2008

(54) MULTI-BAND LOW NOISE AMPLIFIER

(75) Inventor: En-Hsiang Yeh, Hsin-Chu (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/567,739

(22) Filed: Dec. 7, 2006

(65) Prior Publication Data

US 2007/0093230 A1    Apr. 26, 2007

Related U.S. Application Data

(63) Continuation of application No. 10/709,612, filed on May 18, 2004, now Pat. No. 7,187,239.

(30) Foreign Application Priority Data

May 20, 2003    (TW)    ............................. 92113644 A (51) Int. Cl.
 *H03F 3/68* (2006.01)
(52) U.S. Cl. .................................... 330/126
(58) Field of Classification Search ............... None
See application file for complete search history.

(56) References Cited

U.S. PATENT DOCUMENTS

| 6,006,080 A * | 12/1999 | Kato et al. .................. 455/323 |
| 6,215,355 B1 | 4/2001 | Meck et al. |
| 6,501,331 B2 | 12/2002 | Adar |
| 6,710,662 B2 * | 3/2004 | Wang .......................... 330/295 |
| 6,791,417 B2 | 9/2004 | Pengelly et al. |
| 6,882,223 B2 * | 4/2005 | Hsu et al. .................... 330/252 |
| 6,909,325 B2 | 6/2005 | Saito |
| 7,002,411 B2 * | 2/2006 | Yeh .............................. 330/252 |
| 7,023,272 B2 * | 4/2006 | Hung et al. .................. 330/126 |
| 7,187,239 B2 * | 3/2007 | Yeh .............................. 330/295 |
| 7,245,187 B2 * | 7/2007 | Khajehpour ................. 330/305 |
| 2005/0231290 A1 | 10/2005 | Hung et al. |

* cited by examiner

*Primary Examiner*—Robert Pascal
*Assistant Examiner*—Krista M Flanagan
(74) *Attorney, Agent, or Firm*—Winston Hsu (57) ABSTRACT

A multi-band low noise amplifier capable of operating in a plurality of band modes includes a plurality of input amplifiers respectively corresponding to the plurality of band modes and a single output amplifier. Each input amplifier includes a receiving port for receiving a corresponding input signal in one of the plurality of band modes. The single output amplifier includes at least one port coupled to the plurality of input amplifiers and an output port for outputting a signal processed by the single output amplifier.

21 Claims, 11 Drawing Sheets

MULTI-BAND LOW NOISE AMPLIFIER

CROSS REFERENCE TO RELATED APPLICATIONS

This continuation application claims the benefit of co-pending U.S. application Ser. No. 10/709,612, which was filed on May 18, 2004 and entitled "MULTI-BAND LOW NOISE AMPLIFIER".

BACKGROUND OF THE INVENTION

1. Field of the Invention

The invention relates to a multi-band low noise amplifier capable of operating in a plurality of band modes, and more particularly, to a method for connecting an output amplifier to at least one of a plurality of input amplifiers in cascode connection at a lowest-impedance node, so as to reduce the impedance of the multi-band low noise amplifier.

2. Description of the Prior Art

Following the trend of wireless communications development, the upcoming wireless communication systems may include a variety of standards. A mobile phone may operate in a wireless communications system with different frequency bands, such as GSM900+DCS1800+PCS1900 (GSM: global system for mobile communication; DCS1800 is also called GSM1800; PCS1900 is also called GSM1900), AMPS+GSM (AMPS: advance mobile phone service), CDMA+GSM (CDMA: code division multiple access), GSM+bluetooth, and GSM+WLAN (WLAN: wireless local area network). Moreover, integrated with multi-media services, communication instruments can expand their functionality and compatibility. Therefore, for each component of the wireless communication terminal instrument, a related function for processing signals of various standards should be equipped. Regarding a low noise amplifier (LNA), the multi-band low noise amplifier, which can be operated in a plurality of band modes, becomes essential in a receiver of the wireless communication system.

Figure 1:
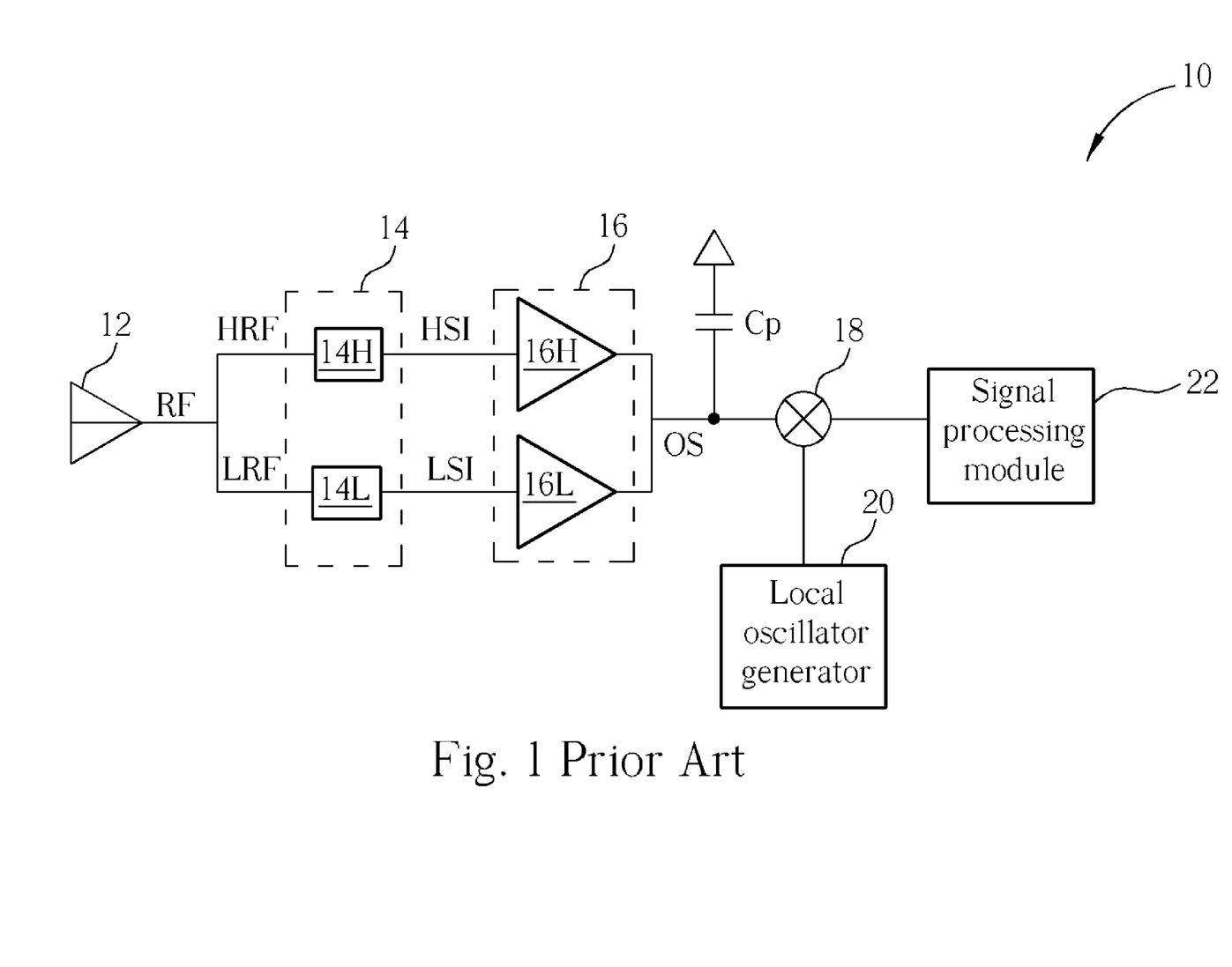
FIG. 1 is a functional block diagram of a conventional receiver of a wireless communication system.

The multi-band low noise amplifier is mainly used to provide required gains and sensitivity for a received signal from an antenna. Since the multi-band low noise amplifier is installed in the front end of the receiver for processing generally weak signals, performances of the multi-band low noise amplifier, such as the noise figure, the RF gain, and linearity, are very important to the overall performances of the receiver. FIG. 1 is a functional block diagram of a conventional receiver 10 of the wireless communication system. The receiver 10 is mainly applied in the wireless communication system operated in a frequency band of 0.9 GHz to 10 GHz since most of the commercial wireless communication systems, such as GSM900/DCS1800/PCS1900, blue-tooth, and WLAN, are operated in this frequency band. The receiver 10 includes a multi-band antenna 12, a set of filters 14, a multi-band low noise amplifier 16, a mixer 18, a local oscillator generator 20, and a signal processing module 22. The multi-band antenna 12 can be used to receive an RF signal RF of different frequencies, and the present embodiment includes two band modes, a high band mode and a low band mode. In the present embodiment, RF signal RF received by the multi-band antenna 12 can be classified into a high RF signal HRF and a low RF signal LRF, which respectively pass a high band filter 14H and a low band filter 14L for filtering process to respectively become a high band input signal HSI and a low band input signal LSI. The high band input signal HSI and the low band input signal LSI will be respectively amplified by the multi-band low noise amplifier 16 by a gain ratio. After the multi-band low noise amplifier 16 outputs the amplified signal, the mixer 18 can cooperate with the local oscillator generator 20 to down-convert the frequency of the outputted signal to a predetermined frequency, and the signal processing module 22 then proceeds with advanced operations of intermediate-frequency (IF) amplification, signal demodulation, and image rejection.

According to the prior art receiver 10 shown in FIG. 1, the multi-band low noise amplifier 16 is substantially a combination of two single-band low noise amplifiers, a high band low noise amplifier 16H and a low band low noise amplifier 16L, for respectively receiving and processing the high band input signal HSI and the low band input signal LSI. The output port of the high band low noise amplifier 16H is coupled to the output port of the low band low noise amplifier 16L to achieve the prior art multi-band low noise amplifier 16. Please refer to FIG. 2, which is a functional block diagram of the conventional multi-band low noise amplifier 16 shown in FIG. 1. The multi-band low noise amplifier 16 includes a high band low noise amplifier 16H and a low band low noise amplifier 16L. In each low noise amplifier, a preset bias can be adjusted in a plurality of gain modes according to the received input signal. In any period of time, the multi-band low noise amplifier 16 can operate only in a band mode. For instance, when the received signal is the high RF signal HRF, after being processed by the high band filter 14H, the generated high band input signal HSI will be transmitted to the high band low noise amplifier 16H. In the meantime, the low band low noise amplifier 16L does not operate. The high band low noise amplifier 16H includes a high band receiving port InH, three transistors $QH_1$-$QH_3$, adjustable three preset biases $BH_1$-$BH_3$, an internal resistor RBH, and a high band output port OUTH. The high band receiving port InH is used to receive the high band input signal HSI, and the transistors $QH_1$-$QH_3$ can be used to amplify the high band input signal HSI by corresponding gain ratio in various gain modes according to the relative values of the three biases $BH_1$-$BH_3$. At last, an output port OS of the multi-band low noise amplifier 16 can be used to output the amplified high band input signal HSI. When the low band input signal LSI requires being processed, the low band low noise amplifier 16L operates and the high band low noise amplifier 16H does not. Similar to the above-mentioned characteristics of the high band low noise amplifier 16H, the low band low noise amplifier 16L also includes a low band receiving port InL, three transistors $QL_1$-$QL_3$, three adjustable preset biases $BL_1$-$BL_3$, and a low band output port OUTL. The preset biases $BL_1$-$BL_3$ can be arranged so that the low band low noise amplifier 16L can operate in various gain modes. An output port OS of the multi-band low noise amplifier 16 can be used to the processed low band input signal LSI. The output port OS is shared by the high band low noise amplifier 16H and the low band low noise amplifier 16L.

Figure 2:
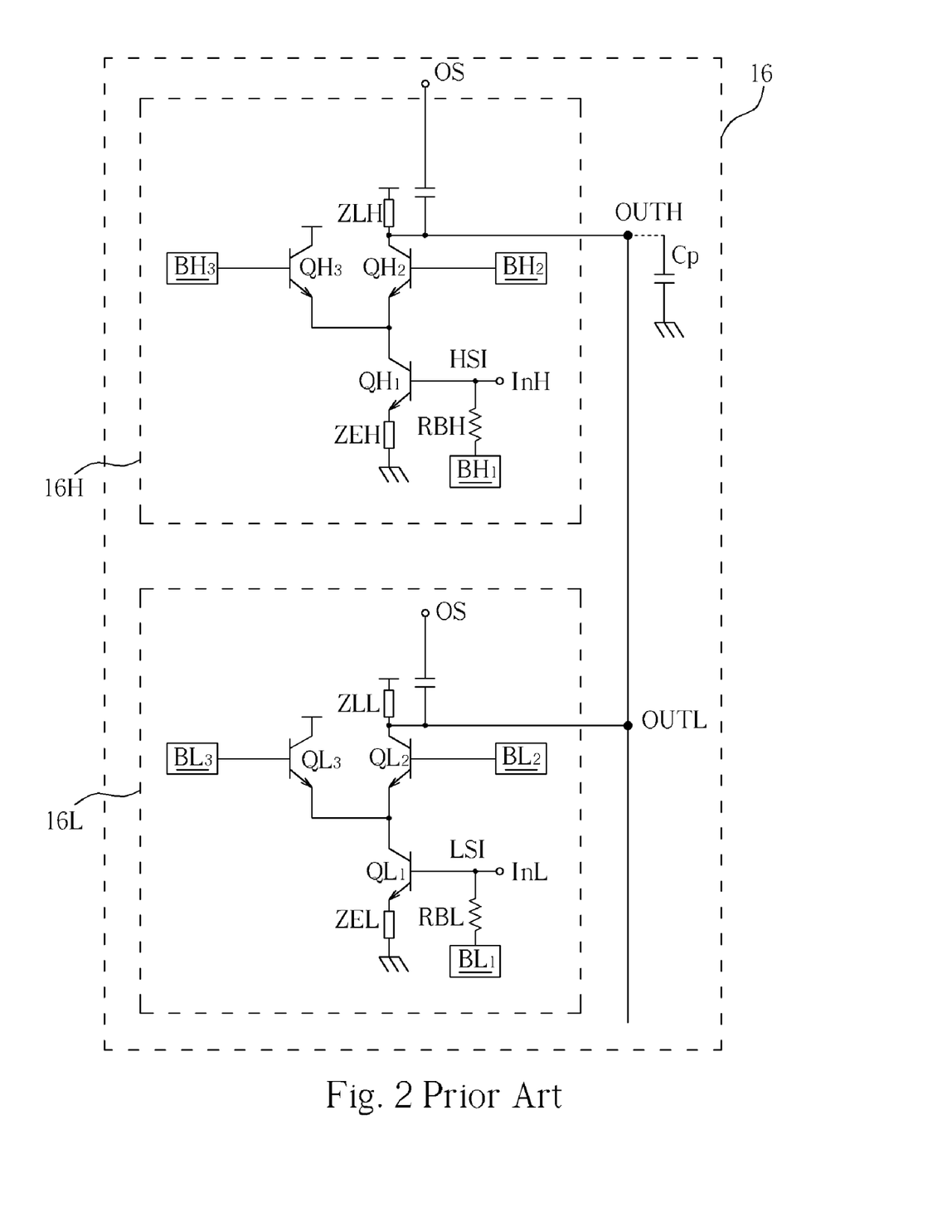
FIG. 2 is a functional block diagram of the conventional multi-band low noise amplifier shown in FIG. 1.

Please note that, first, in the prior art receiver 10, the high band output port OUTH of the high band low noise amplifier 16H is coupled to the low band output port OUTL of the low band low noise amplifier 16H to be integrated as the multi-band low noise amplifier 16 with a single output port (the output port OS). The coupled nodes (OUTH, OUTL) are equivalent to the output port OS of the multi-band low noise amplifier 16. Moreover, when being implemented, the number of band modes is probably more than two (high/low), and the number of low noise amplifiers for processing the band modes increases while increasing the number of band modes; that is, no matter what the number of the low noise amplifiers is, in the prior art, the output ports of the (single-band) low noise amplifiers are coupled to each other so as to be integrated into the multi-band low noise amplifier with a single output. However, the output port of each low noise amplifier is a high impedance node of the low noise amplifier. After the output ports of the low noise amplifiers are coupled to each other, impedance value of the coupled node is also high. Please refer to both FIG. 1 and FIG. 2. As shown in FIG. 2, the impedance value of the high band output port OUTH of the high band low noise amplifier 16H is mainly contributed by an internal impedance ZLH. Similarly, the impedance value of the low band output port OUTL of the low band low noise amplifier 16L is mainly contributed by an internal impedance ZLL. The internal impedances ZLH, ZLL both have high impedance values so the output port OS of the multi-band low noise amplifier 16 shown in FIG. 1 also has a high impedance. Please note that, in the receiver 10 shown in FIG. 1, since the output port OS of the multi-band low noise amplifier 16 is the node at which the output ports of a plurality of (for example, two) low noise amplifiers are coupled to, an effective parasitic capacitor Cp is generated so the high impedance of the output port OS (combined with parasitic capacitor Cp) will lead to a decay of the output signal and a deteriorated frequency response performances of the multi-band low noise amplifier 16.

SUMMARY OF THE INVENTION

It is therefore an objective of the present invention to resolve the above-mentioned problems and provide a multi-band low noise amplifier with reduced impedance at its output port.

In the embodiment, a novel multi-band differential amplifier is disclosed. The novel multi-band differential amplifier operates in the differential mode, and includes two novel multi-band low noise amplifiers with characteristics of the present invention. The multi-band differential amplifier of the embodiment includes a plurality of input amplifiers and two output amplifiers (a positive output amplifier and a negative output amplifier). A coupled node of the input amplifier and the output amplifier is set at a lowest-impedance node of the multi-band differential amplifier in order to prevent the output signal from being affected by the parasitic capacitor of the coupled node. Due to the characteristics of the differential mode, the differential amplifier of the embodiment can be free from the interference and has a wider frequency response.

According to the embodiment, a novel multi-band low noise amplifier capable of operating in a plurality of band modes is disclosed. The novel multi-band low noise amplifier comprises a plurality of input amplifiers respectively corresponding to the plurality of band modes. Each input amplifier has a receiving port for receiving a corresponding input signal in the band mode. The amplifier also includes an output amplifier comprising at least a lowest-impedance port being a lowest-impedance node of the multi-band low noise amplifier, the output amplifier being coupled to the plurality of input amplifiers at the lowest-impedance port, and an output port for outputting the input signal processed by the output amplifier.

According to the embodiment, a method used in a multi-band low noise amplifier is also disclosed. The multi-band low noise amplifier comprises a plurality of input amplifiers and an output amplifier, the plurality of input amplifiers respectively corresponding to a plurality of band modes. The method comprises utilizing the plurality of input amplifiers to respectively receive a plurality of input signals corresponding to the plurality of band modes, connecting the output amplifier to the plurality of input amplifiers at a lowest-impedance node of the multi-band low noise amplifier in cascode connection, and utilizing the output amplifier to process and output the plurality of input signal.

According to the embodiment, a multi-band differential amplifier being operated in a plurality of band modes comprises a plurality of input amplifiers comprising a plurality of positive input amplifiers and a plurality of negative input amplifiers, each band mode corresponding to a positive input amplifier and a negative input amplifier, each positive input amplifier comprising a positive receiving port and at least a positive negative feedback circuit for receiving a positive input signal in the corresponding band mode; each negative input amplifier comprising a negative receiving port and at least a negative negative-feedback circuit for receiving a negative input signal in the corresponding band mode. The multi-band differential amplifier also comprises a positive output amplifier comprising at least a positive lowest-impedance port, the positive output amplifier being coupled to the plurality of positive input amplifiers in cascode connection at a positive lowest-impedance port, the positive output amplifier cooperating with a positive output loading impedance to output the processed positive input signal. The multi-band differential amplifier further comprises a negative output amplifier comprising at least a negative lowest-impedance port, the negative output amplifier being coupled to the plurality of negative input amplifiers in cascode connection at a negative lowest-impedance port, the negative output amplifier cooperating with a negative output loading impedance to output the processed negative input signal.

These and other objectives of the present invention will no doubt become obvious to those of ordinary skill in the art after reading the following detailed description of the preferred embodiment that is illustrated in the various figures and drawings.

DETAILED DESCRIPTION

According to the present invention, we classify the multi-band low noise amplifier into a single-ended mode and a differential mode. The differential mode is based on the characteristics in the single-ended mode according to the present invention and equipped with advantages of signal processing in the differential mode. In addition, the basic structure of the multi-band low noise amplifier according to the present invention is that the combination of two stages of amplifiers in cascode connection forms a multi-band low noise amplifier. The two stages of amplifiers are respectively an input amplifier and an output amplifier for receiving and processing signals in a plurality of band modes. The multi-band low noise amplifier includes a plurality of input amplifiers respectively corresponding to the plurality of band modes, and the plurality of input amplifiers are coupled to a shared output amplifier to be integrated as the multi-band low noise amplifier with an output port. Please refer to FIG. 3, which is a schematic diagram of a multi-band low noise amplifier 26 according to the first embodiment of the present invention. The multi-band low noise amplifier 26 includes an output amplifier 26A and a plurality of input amplifiers $26B_1$, $26B_2$, ..., and $26B_n$, where n is an integer. The number of the input amplifiers $26B_1$, $26B_2$, ..., $26B_n$ is related to the number of desired band modes. The plurality of the input amplifiers respectively correspond to a plurality of band modes. For instance, a first input amplifier $26B_1$ corresponds to a first band mode (high frequency) while the second input amplifier $26B_2$ corresponds to a second band mode (low frequency), and so forth. In a period of time, the multi-band low noise amplifier 26 can operate only in one of the plurality of band modes. Therefore, only the input amplifier and the output amplifier corresponding to the band mode can operate. For instance, if the multi-band low noise amplifier 26 operates in the first band mode, a first input signal $SI_1$ is received by the first input amplifier $26B_1$, while the other input amplifiers $26B_2$, ..., $26B_n$ do not operate. Similarly, when the multi-band low noise amplifier 26 operates in the second band mode, only the second input amplifier $26B_2$ is used to receive and process a second input signal SI2 while the other input amplifiers $26B_1$, $26B_3$, ..., $26B_n$ are suspended.

Figure 3:
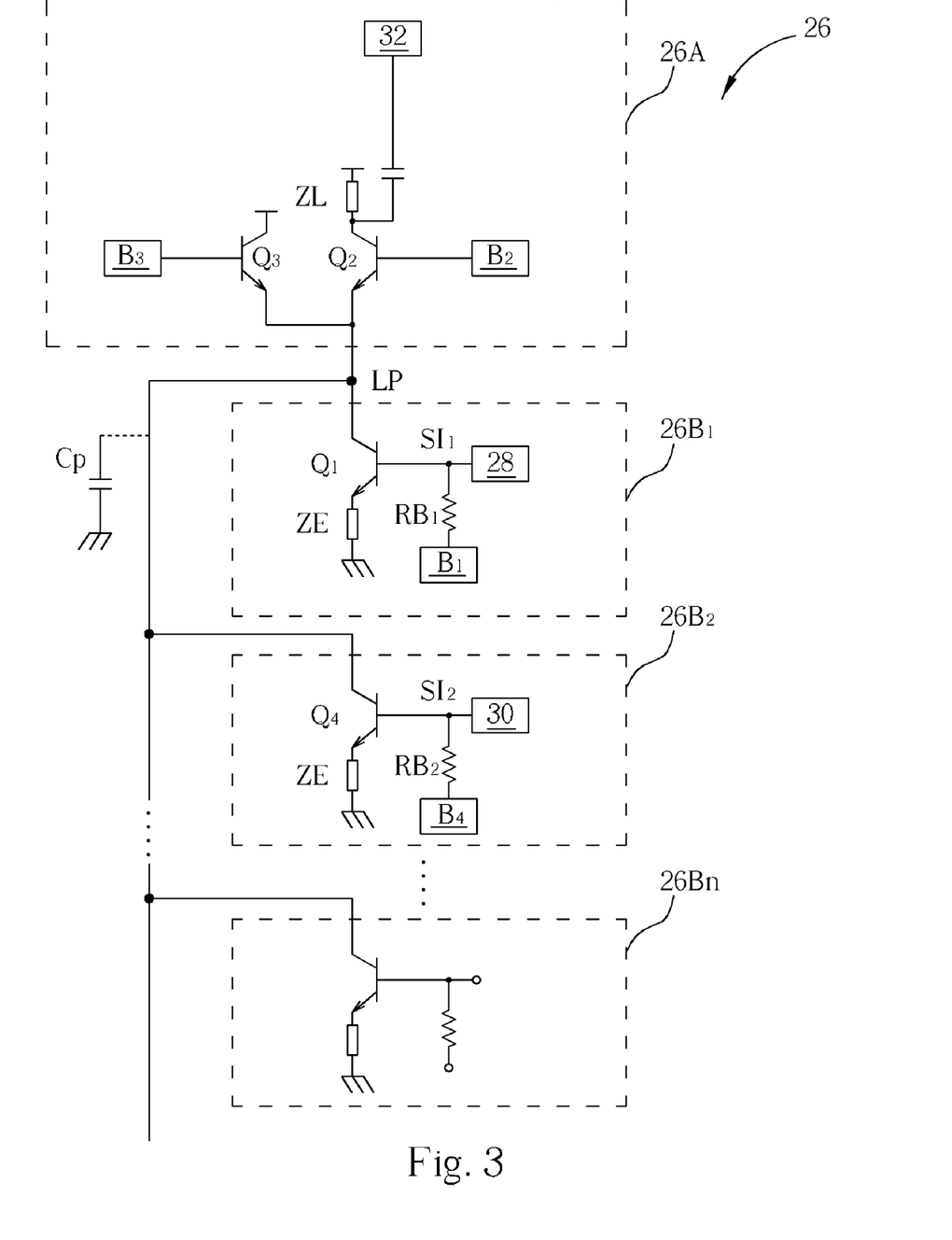
FIG. 3 is a schematic diagram of a multi-band low noise amplifier according to the first embodiment of the present invention.

The output amplifier 26A includes an output port 32, and the output port 32 is the one and only output port of the multi-band low noise amplifier 26. The output amplifier 26A includes transistors $Q_2$, $Q_3$, and two adjustable preset biases $B_2$, $B_3$. The first input amplifier $26B_1$ includes a first receiving port 28 for receiving the first input signal $SI_1$ in the first band mode. The first input amplifier $26B_1$ further includes a transistor $Q_1$, an adjustable preset bias $B_1$, and an internal resistor $RB_1$ for processing the received first input signal $SI_1$. The other input amplifiers $26B_2$, ..., $26B_n$ have the same characteristics as the first input amplifier $26B_1$. For instance, the second input amplifier $26B_2$ includes a second receiving port 30, a transistor $Q_4$, an adjustable preset bias $B_4$, and an internal resistor $RB_2$ for receiving and processing the second input signal $SI_2$. Please note that, first of all, regarding both the output amplifier 26A and the first input amplifiers $26B_1$, the output amplifier 26A can be integrated with the first input amplifier $26B_1$ into a single-band low noise amplifier, such as the prior art high single-band low noise amplifier 16H shown in FIG. 2. Similarly, each of the input amplifiers $26B_2$, ..., $26B_n$ can be integrated with the output amplifier 26A into a single-band low noise amplifier. In the embodiments, we classify a (single-band) low noise amplifier into two stages of amplifiers: an input stage and an output stage. The plurality of input amplifiers, which correspond to a plurality of different band modes, are coupled to a shared output amplifier to form the multi-band low noise amplifier 26. In this way, the low multi-band low noise amplifier 26 occupies less circuit area and leads to lower cost.

Moreover, the input amplifiers and the output amplifier are coupled to each other in cascode connection while the coupled node is the lowest-impedance node of the multi-band low noise amplifier. Please continue to refer to FIG. 3. Concerning the output amplifier 26A and the first input amplifier $26B_1$, the two amplifiers are coupled to each other at a lowest-impedance node LP of the multi-band low noise amplifier 26. Though the node at which circuits are coupled to is associated with an effective parasite capacitor Cp, the node LP has the lowest impedance, so the RC low-pass filter formed by the parasite capacitor Cp and the low impedance will lead to a least signal deterioration. The above-mentioned characteristic can be applied to all the other combinations of the input amplifiers 26B and the output amplifier 26A. When being implemented, the type of the transistors $Q_1$-$Q_4$ of the present embodiment is not limited. The transistors $Q_1$-$Q_4$ can be bipolar junction transistors (BJT), MOS (metal-oxide semiconductor) transistors, and/or transistors of other types. As shown in FIG. 3, if the transistors $Q_1$-$Q_4$ in the first embodiment are implemented with BJTs, the receiving port of each of the input amplifiers $26B_1$, $26B_2$, ..., $26B_n$ can be arranged as coupled to the base of the BJT (for instance, in the first input amplifier $26B_1$, the first receiving port 28 can be arranged as coupled to the base of the BJT $Q_1$). In the output amplifier 26A, the output port 32 can be arranged as coupled to the collector of the BJT $Q_2$; the lowest-impedance port LP couples to the emitters of the two BJTs $Q_2$, $Q_3$ and also couples to the collectors of the BJT $Q_1$, $Q_4$. In addition, the output amplifier 26A in the embodiment shown in FIG. 3 further includes a loading ZL, and the loading ZL could be a resistive loading or an inductive loading. Furthermore, each input amplifier 26B includes a negative feedback circuit ZE. The negative feedback circuit ZE could be a resistive negative feedback circuit or an inductive negative feedback circuit for impedance matching, improving linearity, and increasing operating frequency range.

Figure 4:
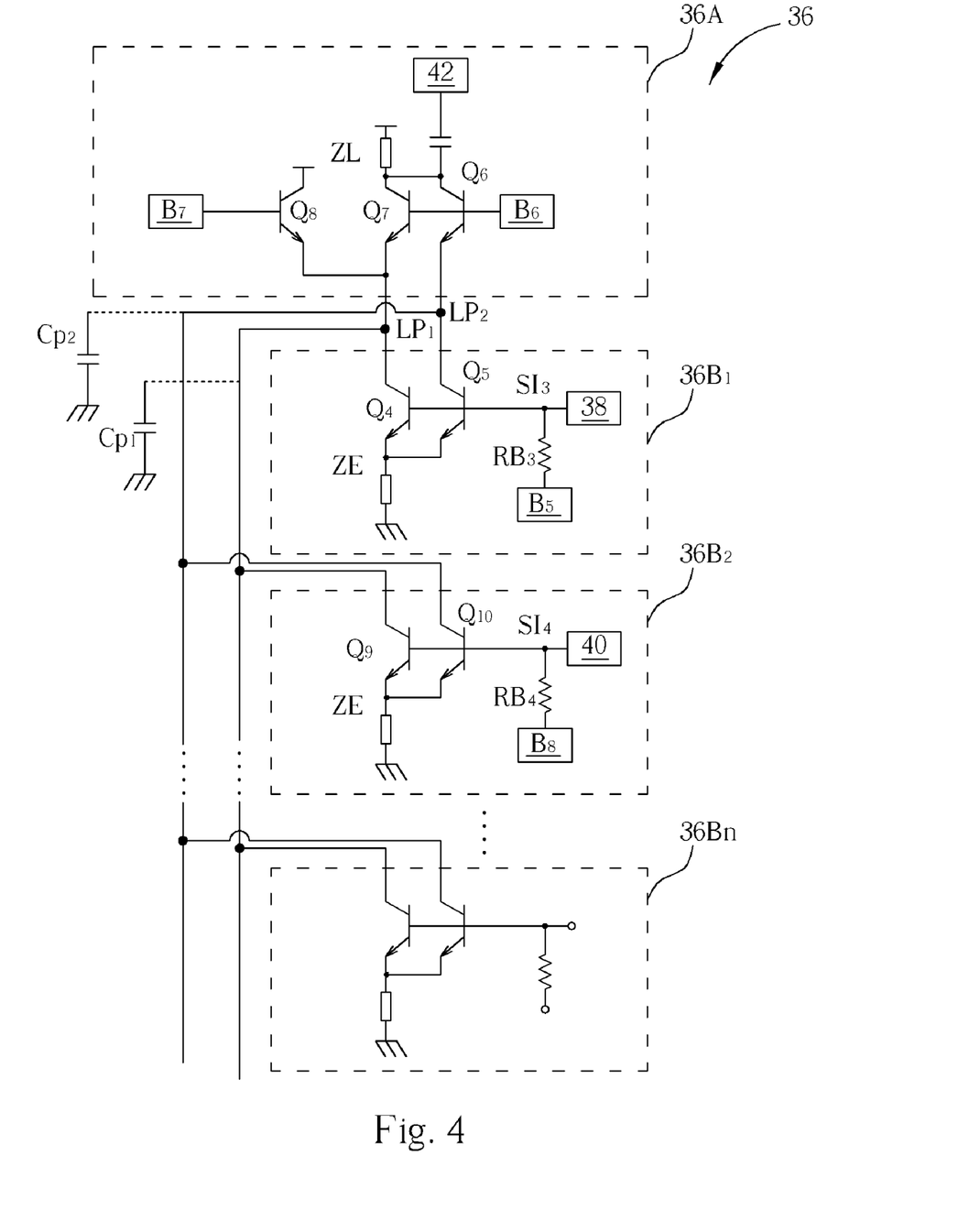
FIG. 4 is a schematic diagram of a multi-band low noise amplifier according to the second embodiment of the present invention.

Please refer to FIG. 4, which is a schematic diagram of a multi-band low noise amplifier 36 according to the second embodiment of the present invention. The structure of the present embodiment is similar to that shown in FIG. 3 while the structure of the present embodiment is more sophisticated to achieve more advantages. The multi-band low noise amplifier 36 also includes an output amplifier 36A and a plurality of input amplifiers 36B1, $36B_1$, $36B_2$, ..., $36B_n$. The plurality of input amplifiers respectively correspond to a plurality of band modes. For instance, the first input amplifier $36B_1$, which corresponds to a third band mode (high frequency), can make use of a first receiving port 38 to receive and process a third input signal $SI_3$. The second input amplifier $36B_2$, which corresponds to a fourth band mode (low frequency), can make use of a second receiving port 40 to receive and process a fourth input signal $SI_4$. It is noted that the number of the input amplifiers $36B_1$, $36B_2$, ..., $36B_n$ is related to the number of desired band modes. In a period of time, the multi-band low noise amplifier 36 can operate only in a band mode; that is, only the input amplifiers and the output amplifier corresponding to the band mode can operate. The output amplifier 36A includes an output port 42, and the output port 42 is the one and only output port of the multi-band low noise amplifier. The transistors $Q_4$-$Q_{10}$ and the four adjustable preset biases $B_5$-$B_8$ can cooperate to achieve signal amplification and switch among various gain modes. The transistors $Q_4$ and $Q_5$ are biased by the bias $B_5$ through the resistor $RB_3$. The transistors $Q_9$ and $Q_{10}$ are biased by the bias $B_8$ through the resistor $RB_4$.

Figure 5:
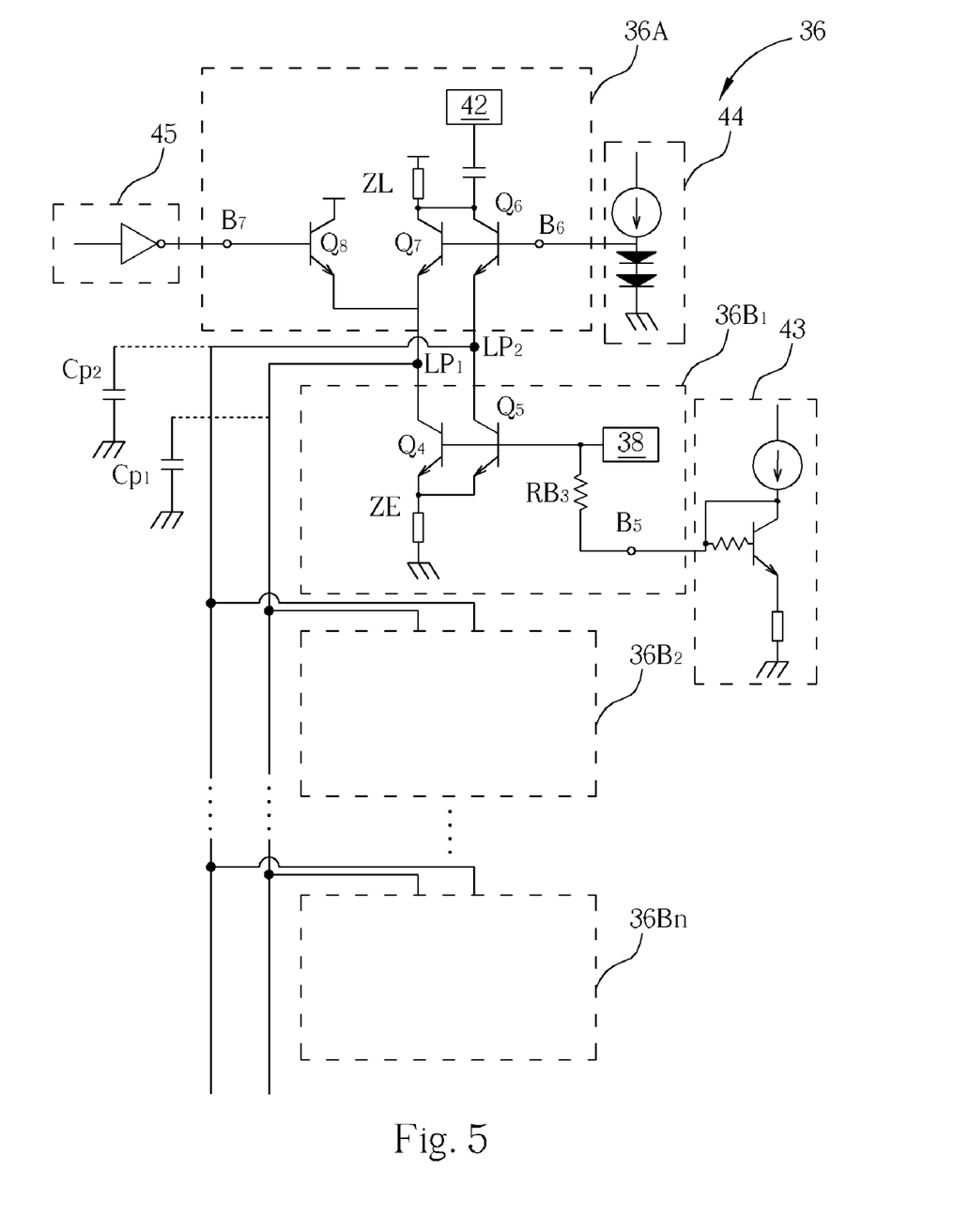
FIG. 5 is a schematic diagram of one detailed implementation of the second embodiment shown in FIG. 4.

The multi-band low noise amplifier 36 of the present embodiment can operate not only in various band modes, but also in various gain modes. For instance, the multi-band low noise amplifier 36 in the present embodiment can be designed to operate in two gain modes: a high gain mode and a low gain mode. Regarding the first input amplifier $36B_1$ and the output amplifier 36A, when the bias $B_6$ is higher than the bias $B_7$, the (high-frequency) third input signal $SI_3$ will be amplified via transistors $Q_4$, $Q_5$, $Q_6$, $Q_7$ and outputted to the output port 42. Thus most of the third input signal $SI_3$ will be transmitted to the output port 42 for outputting while the multi-band low noise amplifier 36 is in the high gain mode. On the other hand, when the bias $B_7$ is higher than the bias $B_6$, most of the third input signal $SI_3$ will pass the transistors $Q_4$, $Q_8$ to the collector of the transistor $Q_8$ while little third input signal $SI_3$ passes the transistors $Q_5$, $Q_6$ to the output port 42. Therefore, the multi-band low noise amplifier 36 operates in the low gain mode. Therefore, in the present embodiment, the switch between the high gain mode and the low gain mode can be implemented by arranging the relative magnitude of the bias $B_7$ and the bias $B_6$. Please refer to FIG. 5, which is a schematic diagram of a detailed embodiment of the structure shown in FIG. 4. In order to emphasize that the switch among various gain modes can be implemented by arranging the relative magnitude of a plurality of biases, the present embodiment discloses detailed circuits of three adjustable biases $B_5$-$B_7$. The three biases $B_5$-$B_7$ are respectively provided by the three bias devices 43, 44, 45. When being actually operated, the bias $B_7$ can be kept at a predetermined voltage value, while the bias $B_6$ is adjusted to values higher or lower than the bias $B_7$ to switch gain modes. The transistors $Q_4$ and $Q_5$ are biased by the bias $B_5$ through the resistor $RB_3$.

Please refer back to FIG. 4. The output amplifier 36A and a plurality of the input amplifiers $36B_1$, $36B_2$, . . . , $36B_n$ are coupled to each other in cascode connection. Those amplifiers are coupled to each other at two nodes $LP_1$, $LP_2$, which are the lowest-impedance nodes of the multi-band low noise amplifier 36. When the transistors $Q_4$-$Q_{10}$ of the present embodiment are implemented with BJTs, the lowest-impedance ports $LP_1$, $LP_2$ are respectively the emitters of two BJTs $Q_7$, $Q_6$. Though the two lowest-impedance nodes $LP_1$, $LP_2$ are respectively associated with effective parasite capacitors $Cp_1$, $Cp_2$, the impedance values of the nodes $LP_1$, $LP_2$ are significantly low, so the RC low-pass filter formed by the parasite capacitor $Cp_1$, $Cp_2$ and the low impedance can lead to a least signal deterioration. In addition, the multi-band low noise amplifier 36 of the present embodiment includes a loading ZL and a plurality of negative feedback circuits ZE. The loading ZL could be a resistive loading or an inductive loading, and the negative feedback circuit ZE could be a resistive negative feedback circuit or an inductive the negative feedback circuit to achieve the impedance matching, improving linearity, and increasing operating frequency range.

In order to prevent impedance matching between the multi-band low noise amplifier 36 and the front-end circuit, such as the filter 14 shown in FIG. 1, in different gain modes would fluctuate the frequency response of the front-end circuit and even the performance of the multi-band low noise amplifier 36, the negative feedback circuit ZE could be used to keep the input impedance of the multi-band low noise amplifier 36 stable in various gain modes. If the negative feedback circuit ZE is implemented with an inductive negative feedback circuit, the negative feedback circuit ZE would have the advantage of better signal range and low noise at the cost of more circuit area and thus higher cost. Especially when the number of desired band modes are increased, the number of required inductive negative feedback circuits ZE may be doubled and thus lead to even higher cost. Please refer to FIG. 6, which is a schematic diagram of another detailed embodiment of the multi-band low noise amplifier 36 shown in FIG. 4. In the present embodiment, with a shared negative feedback circuit ZEC, the negative feedback circuits ZE in a plurality of input amplifiers 36B can be replaced by the shared negative feedback circuit ZEC. Therefore, the plurality of input amplifiers 36B only requires a shared (inductive) negative feedback circuit ZEC to achieve stable input impedance.

Figure 6:
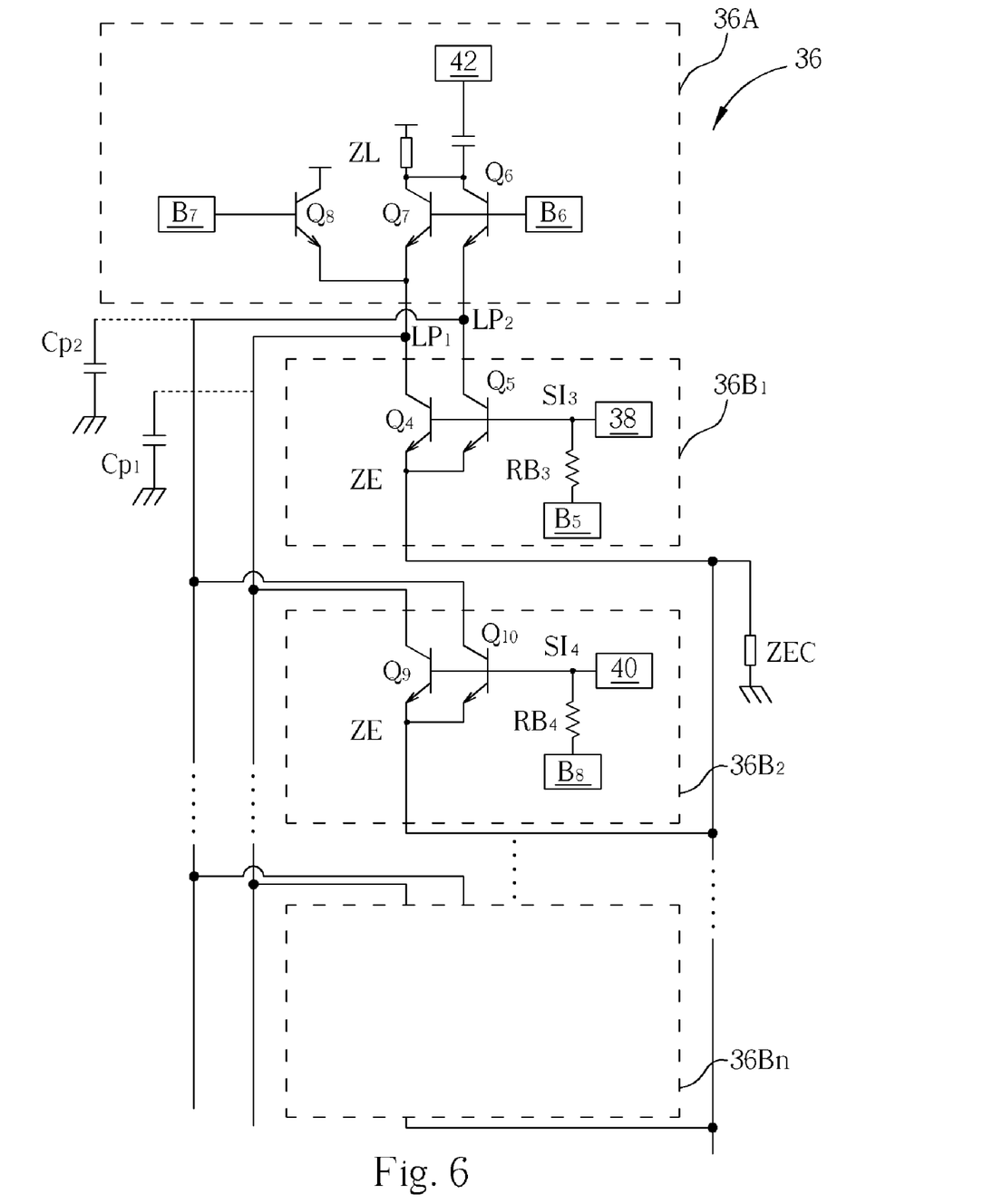
FIG. 6 is a schematic diagram of another detailed implementation of the second embodiment shown in FIG. 4.
Figure 7:
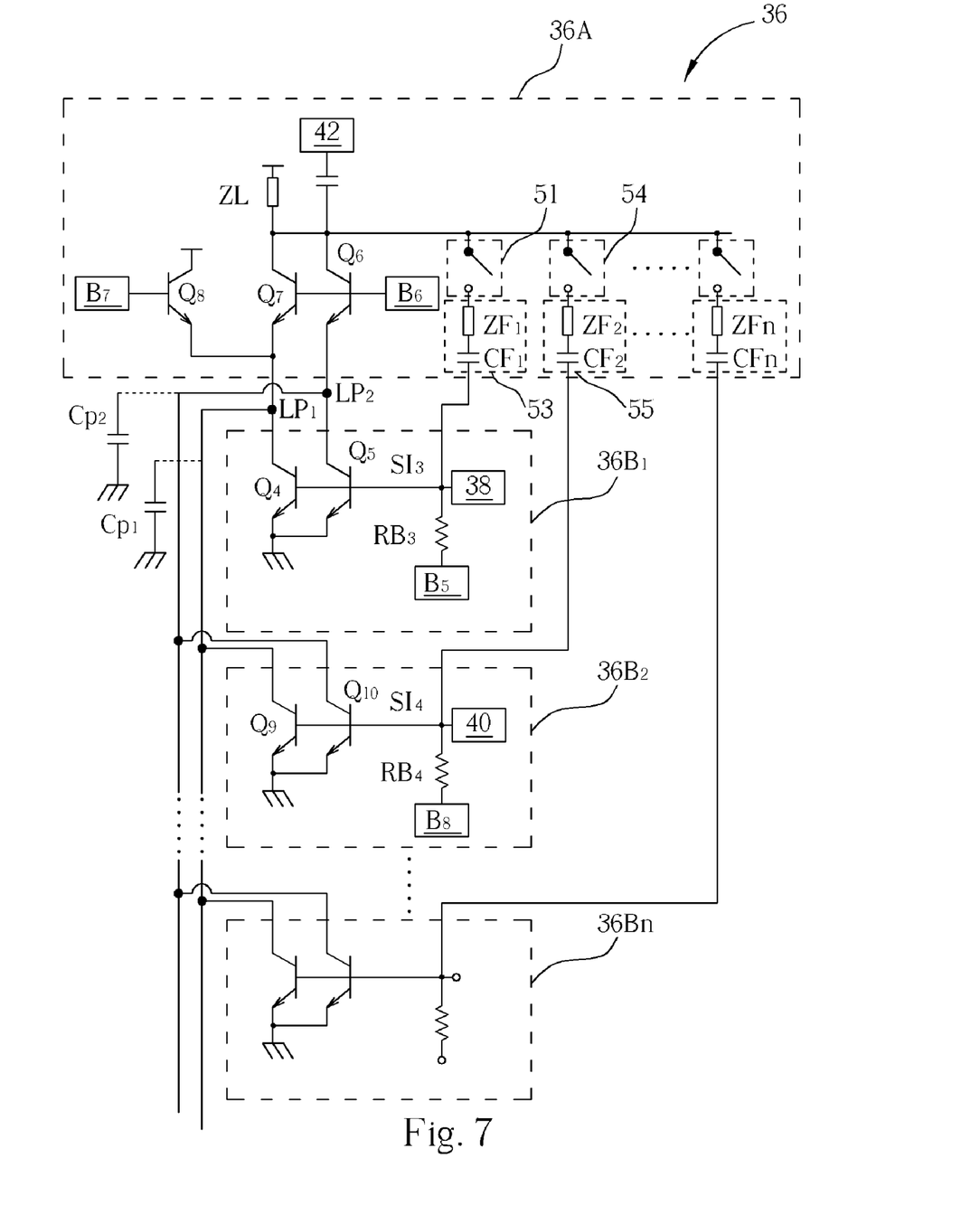
FIG. 7 is a schematic diagram of an alternative of the implementation shown in FIG. 6.

Please refer to FIG. 7, which is a schematic diagram of another embodiment of the multi-band low noise amplifier 36 shown in FIG. 6. The present embodiment utilizes another technique to implement the negative feedback device. A first negative feedback circuit 53, including an impedance $ZF_1$ and a capacitor $CF_1$, and a first switch 51 are arranged between the output amplifier 36A and the first input amplifier $36B_1$. A second negative feedback circuit 55, including an impedance $ZF_2$ and a capacitor $CF_2$, and a second switch 54 are arranged between the output amplifier 36A and the second input amplifier $36B_2$. The above-mentioned characteristic is applied to the other input amplifiers $36B_3$, . . . , $36B_n$ and the output amplifier 36A. The first 51 and the second switch 54 could be respectively implemented by a transistor combined with a control signal. Therefore, in a third band mode (corresponding to the third input signal $SI_3$), only the output amplifier 36A and the first input amplifier $36B_1$ operate. In the meantime, the second switch 54 opens while the first switch 51 conducts so the first negative feedback circuit 53 can perform a negative feedback function in the third band mode without the influence caused by the other input amplifiers $36B_2$, . . . , $36B_n$. Similarly, in a fourth band mode (corresponding to the fourth input signal $SI_4$), the first switch 51 opens while the second switch 54 conducts so the second negative feedback circuit 55 can perform the negative feedback function in the fourth band mode. By properly designing sizes of the impedance $ZF_1$, the capacitor $CF_1$, the impedance $ZF_2$, the capacitor $CF_2$, . . . , and so on, the impedance $ZF_n$, the capacitor $CF_n$, the input impedance of the multi-band low noise amplifier 36 could be stable.

Figure 8:
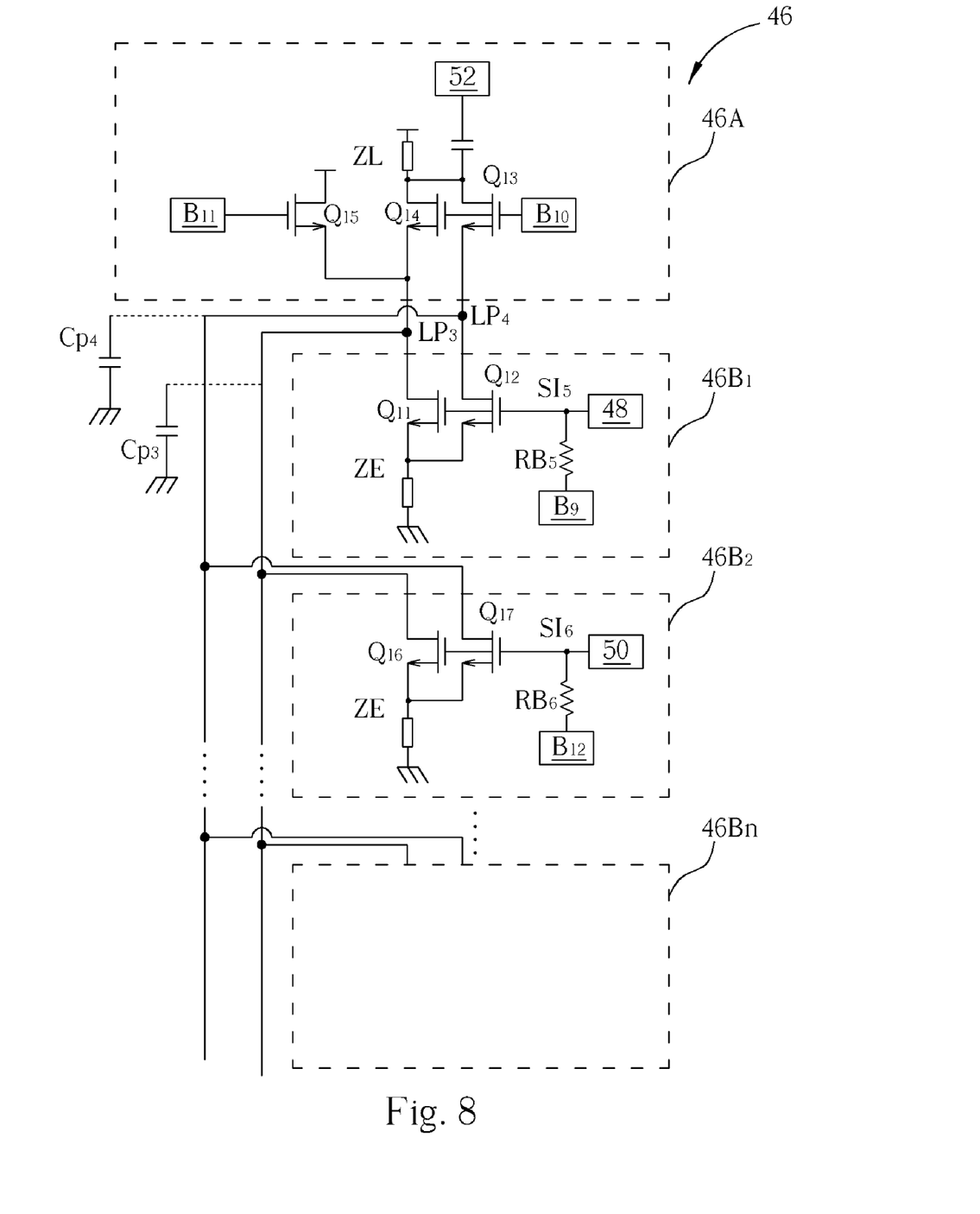
FIG. 8 is a schematic diagram of another multi-band low noise amplifier according to the third embodiment of present invention.
Figure 9:
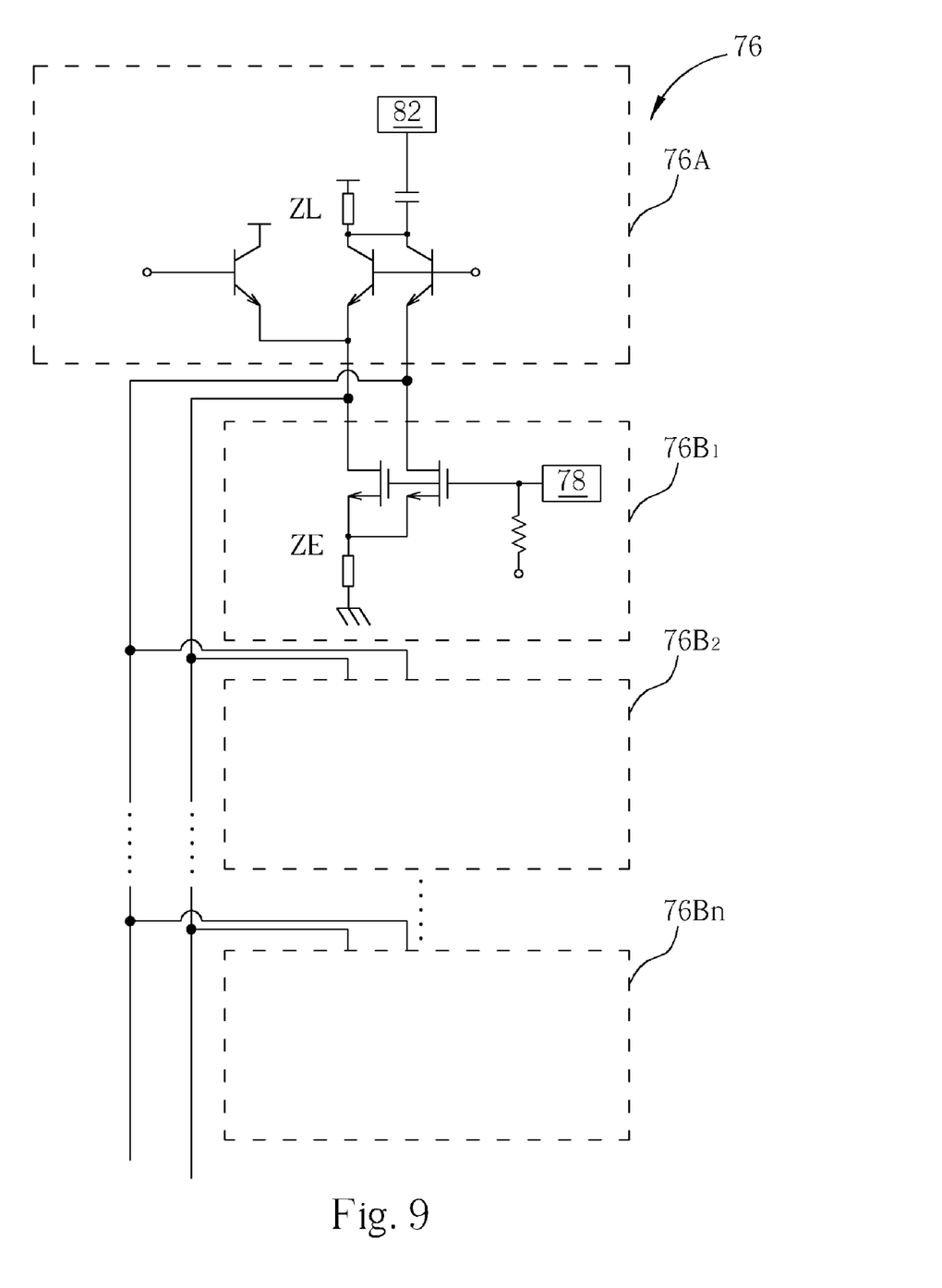
FIG. 9 is a schematic diagram of another multi-band low noise amplifier according to the fourth embodiment of the present invention.

It is noted that the type of the transistors shown in FIG. 3 to FIG. 7 is not limited. Those transistors can be BJTs (Bipolar junction transistors), MOS (Metal-oxide semiconductor) transistors, and transistors of other types. Please refer to FIG. 8, which is a schematic diagram of a multi-band low noise amplifier 46 according to the third embodiment of the present invention. The present embodiment is similar to the second embodiment shown in FIG. 4. The major difference is that the multi-band low noise amplifier 46 in the present embodiment is implemented with MOS transistors. In the present embodiment, the input ports 48, 50 respectively correspond to the input ports 38, 40 shown in FIG. 4, receive input signals $SI_5$ and $SI_6$, and are coupled to internal resistors $RB_5$ and $RB_6$, while the MOS transistors $Q_{11}$-$Q_{17}$ can respectively correspond to the transistors $Q_4$-$Q_{10}$ shown in FIG. 4 and the four adjustable biases $B_9$-$B_{12}$ respectively correspond to the four biases $B_5$-$B_8$ shown in FIG. 4. The output port 52 of the multi-band low noise amplifier 46, which corresponds to the output port 42 of the multi-band low noise amplifier 36 shown in FIG. 4, is the drain of the MOS transistor $Q_{13}$. With characteristics of the present invention, the coupled nodes $LP_3$, $LP_4$ are the lowest-impedance nodes of the multi-band low noise amplifier 46, which are respectively coupled to two sources of the two MOS transistors $Q_{14}$, $Q_{13}$. Therefore, even though the two nodes $LP_3$, $LP_4$ are respectively associated with the effective parasite capacitors $Cp_3$, $Cp_4$, the lowest-impedance coupled nodes in the present invention can lead to the least signal deterioration caused by the parasite the capacitors $Cp_3$, $Cp_4$. In addition, the multi-band low noise amplifier implemented by transistors of various types is disclosed according to the present invention. Please refer to FIG. 9, which is a schematic diagram of a multi-band low noise amplifier 76 according to the fourth embodiment of the present invention. The multi-band low noise amplifier 76 of the present embodiment can be viewed as a mix-mode multi-band low noise amplifier 76. As shown in FIG. 9, the input amplifier 76B is implemented with MOS transistors while the output amplifier 76A is implemented with BJTs. The present embodiment stresses the characteristic of mix-type (of transistors) according to the present invention.

Another aspect of the present invention, differential mode, is disclosed as follows. In the following embodiments, a multi-band differential amplifier combines the characteristics of the above-mentioned multi-band low noise amplifiers. Actually, the multi-band differential amplifier of the present invention is substantially integrated by two amplifiers (single-ended mode) of the multi-band low noise amplifiers of the present invention, wherein one used as a positive amplifier and the other as a negative amplifier. The real output signal is the differential value of two output signals of the two amplifiers. The differentiability of the differential amplifier depends on the accuracy of the phase shift between a positive input signal and a negative input signal. Any inaccuracy of the phase shift of the two input signals (180 degrees) will contribute a common mode signal to affect differentiability of the differential amplifier. Please refer to FIG. 10, which is a functional block diagram of an embodiment of a multi-band differential amplifier 90 according to the present invention. Two band modes of the present embodiment are considered: a high band mode and a low band mode. The multi-band differential amplifier 90 can be treated as a combination of two stages of amplifiers (the input amplifier 90B and output amplifier 90A) coupled to each other in cascode connection. The input amplifier 90B includes two positive input amplifiers 90BPH, 90BPL and two negative input amplifiers 90BNH, 90BNL. The two positive input amplifiers can be classified into a positive high-band input amplifier 90BPH and a positive low-band input amplifier 90BPL according to different band modes. The positive high-band input amplifier 90BPH and the positive low-band input amplifier 90BPL respectively include a positive high-band receiving port 92PH and a positive low-band receiving port 92PL respectively for receiving a positive high-band input signal SIPH and a positive low-band input signal SIPL. Similarly, two negative input amplifiers can be classified into a negative high-band input amplifiers 90BNH and a negative low-band input amplifier 90BNL according to different band modes. The negative high-band input amplifier 90BNH and the negative low-band input amplifier 90BNL respectively include a negative high-band receiving port 92NH and a negative low-band receiving port 92NL for respectively receiving a negative high-band input signal SINH and a negative low-band input signal SINL. The multi-band differential amplifier 90 also includes a positive output amplifier 90AP and a negative output amplifier 90AN. The positive output amplifier 90AP includes at least a positive lowest-impedance port LPP and a positive output port 94P. The positive output amplifier 90AP is coupled to the two positive input amplifiers 90BPH, 90BPL in cascode connection at the positive lowest-impedance port LPP. The positive output port 94P is used to output the processed positive input signal SIPH or SIPL. The negative output amplifier 90AN includes at least a negative lowest-impedance port LPN and a negative output port 94N, and the negative output amplifier 90AN is coupled to the two negative input amplifiers 90BNH, 90BNL in cascode connection at a negative lowest-impedance port LPN. The negative output port 94N can be used to output the processed negative input signal SINH or SINL.

The band modes processed by the multi-band differential amplifier 90 according to the present invention are not constrained to the above-mentioned two band modes. No matter what the number of the desired band modes (corresponding to the input amplifiers 90B) is, characteristics of the present invention can be achieved by coupling all the positive input amplifiers 90BP to the positive output amplifier 90AP in cascode connection at the positive lowest-impedance port LPP and by coupling all the negative input amplifiers 90BN to the negative output amplifier 90AN in cascode connection at the negative lowest-impedance port LPN. The two positive input amplifiers 90BPH, 90BPL and the positive output amplifier 90AP in the present embodiment can be viewed to be equivalent to any of the multi-band low noise amplifiers shown in FIG. 3 to FIG. 9. Similarly, in the present embodiment, the two negative input amplifiers 90BNH, 90BNL and the negative output amplifier 90AN can be combined to be treated as any of the multi-band low noise amplifiers shown in FIG. 3 to FIG. 9. In a period of time, the multi-band differential amplifier 90 can operate in only a band mode. Please refer to FIG. 11, which is a schematic diagram of a detailed embodiment of the multi-band differential amplifier 90 shown in FIG. 10. The embodiment shown in FIG. 11 is implemented by integrating two multi-band low noise amplifiers 36 shown in FIG. 4.

Figure 10:
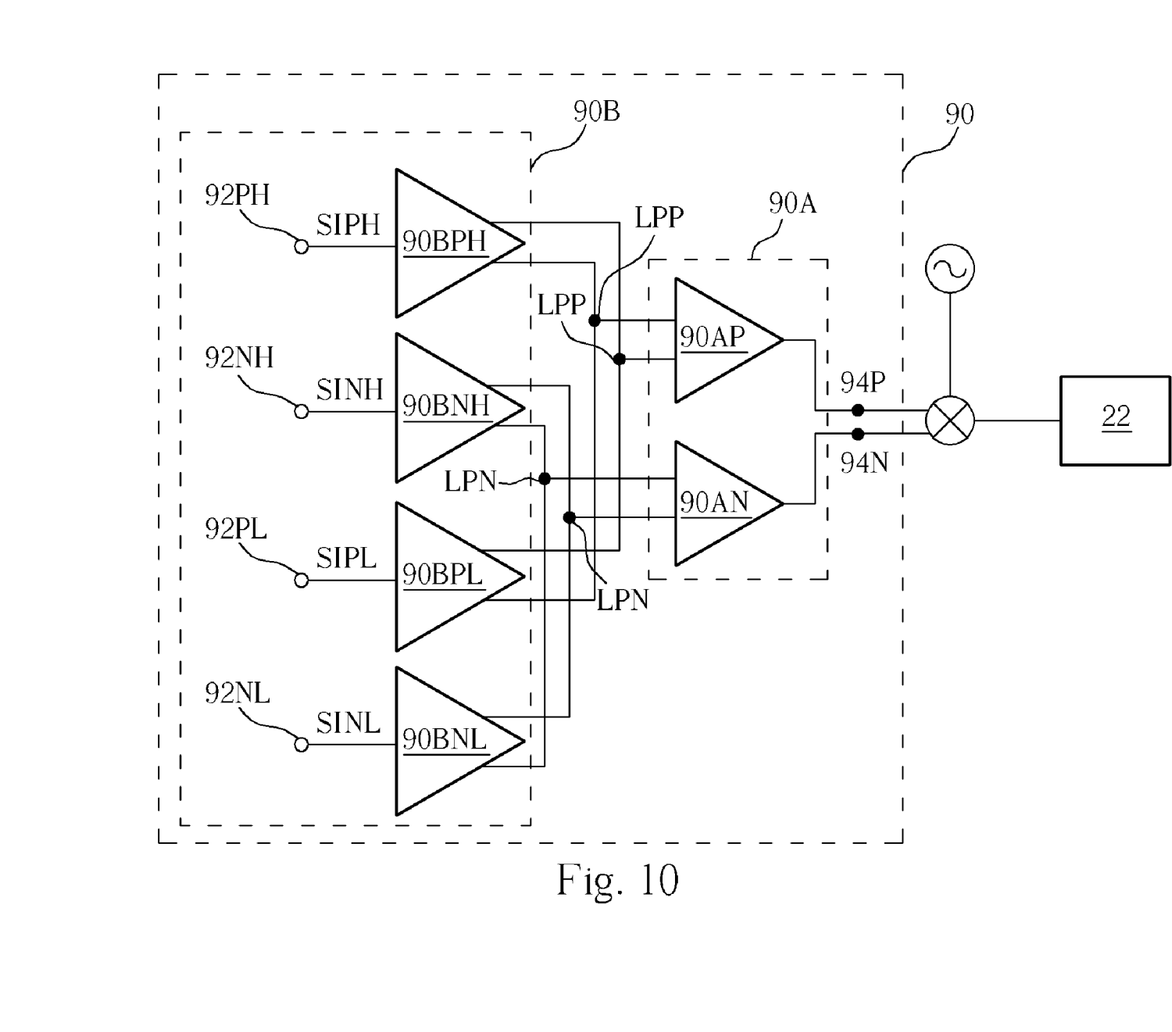
FIG. 10 is a functional block diagram of a multi-band differential amplifier according to one embodiment of the present invention.
Figure 11:
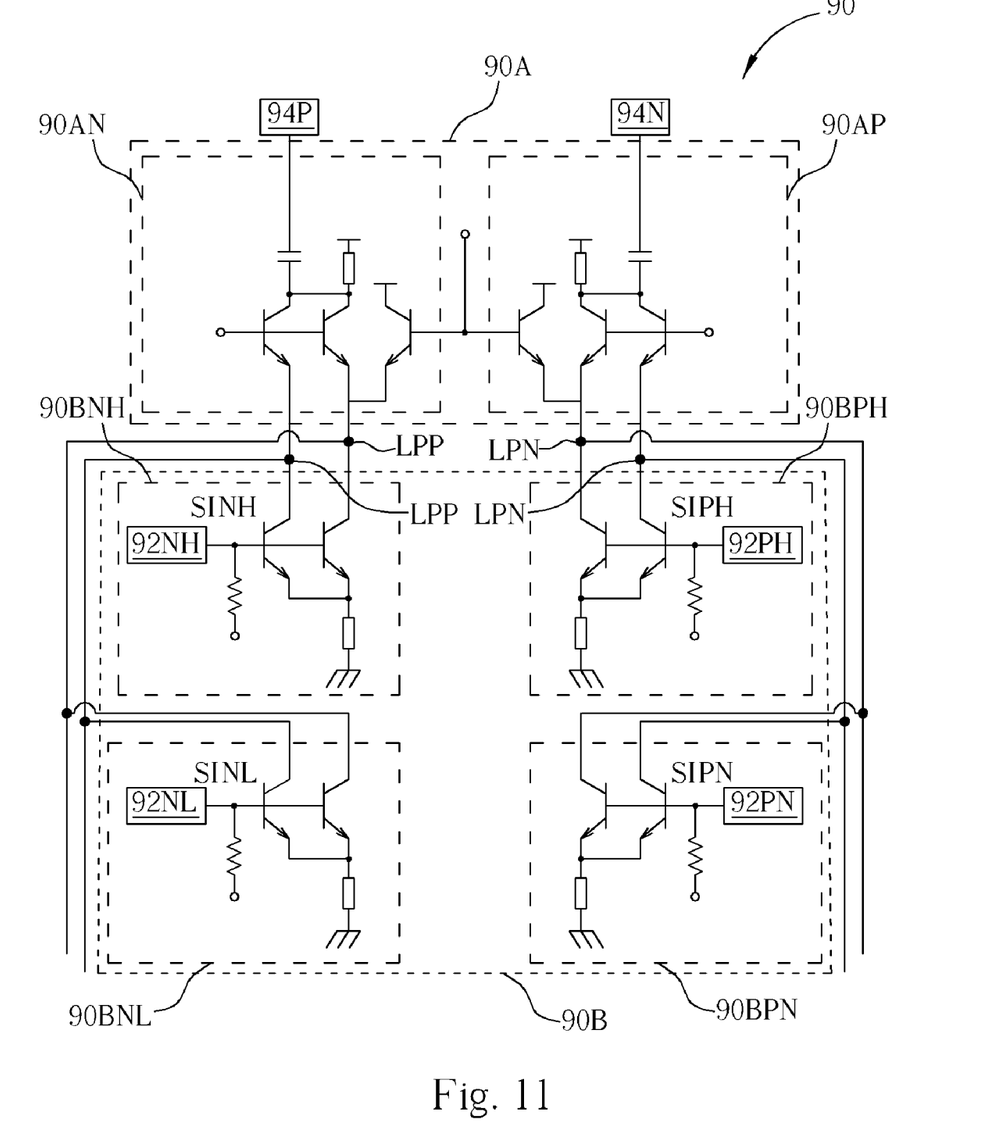
FIG. 11 is a schematic diagram illustrating the implementation of the multi-band differential amplifier shown in FIG. 10.

Please note that, in the embodiment shown in FIG. 10, all the input amplifiers 90B are not required to be implemented with the input amplifiers of the same structure. Similarly, all the output amplifier 90A are not required to be implemented with the output amplifiers of the same structure. The positive lowest-impedance port LPP can be treated as a lowest-impedance node of the whole positive circuit under the condition that a plurality of positive input amplifiers 90BP are coupled to the positive output amplifier 90AP. Similarly, the negative lowest-impedance port LPN can be treated as a lowest-impedance node of the whole negative circuit under the condition that a plurality of negative input amplifiers 90BN are coupled to the negative output amplifier 90AN. Therefore, the multi-band differential amplifier 90 has the same characteristic of the concept that the coupled node (at which a plurality of amplifiers are coupled to each other in cascode connection) is the lowest-impedance node. In addition, in contrast to the single-ended mode amplifier, the multi-band differential amplifier of the present invention can be free from the interference and cause less IP2 ($2^{nd}$ order interception node) in the front-end of a receiver so a DC offset can be reduced. Moreover, the multi-band differential amplifier has a wider frequency response than the single-ended mode amplifier does. Therefore, the multi-band differential amplifier of the present invention can be applied in a receiver of a wireless communication system used as a multi-band low noise differential amplifier.

In the present invention, we disclose various multi-band low noise amplifiers and multi-band low noise differential amplifiers operated in a plurality of band modes. In each of the multi-band low noise (differential) amplifiers, an output amplifier and a plurality of the input amplifiers are coupled to each other in cascode connection at the lowest-impedance node of the multi-band low noise amplifier so the impedance of the coupled node can be reduced and the signal decaying effect caused by the parasite capacitor can be eliminated. In addition, in contrast to the prior art technique, due to that the present invention utilizes an output amplifier to implement the multi-band low noise (differential) amplifier, the circuit area can be significantly reduced. Furthermore, various embodiments of the multi-band low noise (differential) amplifiers are disclosed to meet various demands in communication systems.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-band low noise amplifier operated in a plurality of band modes comprising:
    a plurality of input amplifiers respectively corresponding to the plurality of band modes, each input amplifier comprising a receiving port for receiving a corresponding input signal in one of the plurality of band modes; and
    an output amplifier comprising:
        at least one port coupled to the plurality of input amplifiers; and
        an output port for outputting a signal processed by the output amplifier.

2. The multi-band low noise amplifier of claim 1, wherein the multi-band low noise amplifier is capable of operating in only a band mode in a period of time, and only an input amplifier corresponding to the band mode within the plurality of input amplifiers and the output amplifier operate in the period of time.

3. The multi-band low noise amplifier of claim 1, wherein the output port of the output amplifier is coupled to a loading impedance, and the loading impedance comprises an inductor.

4. The multi-band low noise amplifier of claim 1, further comprising:
    a plurality of negative feedback circuits;
    wherein each negative feedback circuit comprises a resistor, a capacitor, and a switch.

5. The multi-band low noise amplifier of claim 1, further comprising:
    a plurality of negative feedback impedances respectively coupled to emitters of the plurality of input amplifiers;
    wherein each negative feedback impedance is an inductance or a resistance.

6. The multi-band low noise amplifier of claim 1, further comprising:
    at least a negative feedback circuit coupled to emitters of the plurality of input amplifiers;
    wherein the negative feedback circuit is shared by the plurality of input amplifiers.

7. The multi-band low noise amplifier of claim 1, wherein the output amplifier is coupled to each input amplifier in cascode connection.

8. The multi-band low noise amplifier of claim 1, wherein each input amplifier comprises at least a BJT (bipolar junction transistor), and the receiving port is a base of the BJT.

9. The multi-band low noise amplifier of claim 8, wherein the output amplifier comprises at least a BJT, the output port is coupled to a collector of the BJT of the output amplifier, and the at least one port of the output amplifier is coupled to an emitter of the BJT of the output amplifier.

10. The multi-band low noise amplifier of claim 1, wherein each input amplifier comprises at least a MOS (metal-oxide semiconductor) transistor, and the output amplifier comprises at least a MOS transistor.

11. The multi-band low noise amplifier of claim 1 being applied to a receiver of a wireless communication system.

12. A method for amplifying in a plurality of band modes, the method comprising:
    providing a multi-band low noise amplifier, the multi-band low noise amplifier comprising a plurality of input amplifiers and an output amplifier, the plurality of input amplifiers respectively corresponding to the plurality of band modes;
    providing the output amplifier with at least one port for coupling the plurality of input amplifiers;
    providing each input amplifier with a receiving port for receiving a corresponding input signal in one of the plurality of band modes;
    utilizing a receiving port of one of the plurality of input amplifiers to receive an input signal corresponding to one of the plurality of band modes; and
    utilizing the output amplifier to process a signal outputted from the one of the plurality of input amplifiers and correspondingly output a processed signal.

13. The method of claim 12, wherein the multi-band low noise amplifier is capable of operating in only a band mode in a period of time, and the method further comprises:
    utilizing an input amplifier corresponding to the band mode to receive and process a corresponding input signal in the period of time; and
    utilizing the output amplifier to process a processed signal from the input amplifier corresponding to the band mode, in order to output the signal processed by the output amplifier.

14. The method of claim 12, wherein each input amplifiers comprises at least a BJT (Bipolar junction transistor), and the at least one port of the output amplifier is coupled to a collector of the BJT.

15. The method of claim 12, wherein the output amplifier is coupled to each input amplifier in cascode connection.

16. A multi-band differential amplifier operated in a plurality of band modes comprising:
    a plurality of input amplifiers comprising:
        a plurality of positive input amplifiers respectively corresponding to the plurality of band modes, each positive input amplifier comprising a positive receiving port for receiving a positive input signal in a corresponding band mode within the plurality of band modes; and
        a plurality of negative input amplifiers respectively corresponding to the plurality of band modes, each negative input amplifier comprising a negative receiving port for receiving a negative input signal in a corresponding band mode within the plurality of band modes;
    at least a positive negative feedback circuit corresponding to the plurality of positive input amplifiers;
    at least a negative negative-feedback circuit corresponding to the plurality of negative input amplifiers; and
    a single set of output amplifiers comprising:
    a positive output amplifier cooperating with a positive output loading impedance to output a signal processed by the positive output amplifier, the positive output amplifier comprising:
        at least one positive input port coupled to the plurality of positive input amplifiers; and
        a positive output port for outputting the signal processed by the positive output amplifier; and a negative output amplifier cooperating with a negative output loading impedance to output a signal processed by the negative output amplifier, the negative output amplifier comprising:
at least one negative input port coupled to the plurality of negative input amplifiers; and
a negative output port for outputting the signal processed by the negative output amplifier.

17. The multi-band differential amplifier of claim 16, wherein the positive output loading impedance and the negative output loading impedance are respectively inductances, or the positive output loading impedance and the negative output loading impedance are respectively resistances.

18. The multi-band differential amplifier of claim 16, wherein the positive negative feedback circuit comprises an impedance, the negative negative-feedback circuit comprises an impedance, and each impedance is an inductance or a resistance.

19. The multi-band differential amplifier of claim 16, wherein the positive negative feedback circuit is shared by the plurality of positive input amplifiers and coupled to emitters of the plurality of positive input amplifiers, and the negative negative-feedback circuit is shared by the plurality of negative input amplifiers and coupled to emitters of the plurality of negative input amplifiers.

20. The multi-band differential amplifier of claim 16, wherein the positive output amplifier is coupled to each positive input amplifier in cascode connection, and the negative output amplifier is coupled to each negative input amplifier in cascode connection.

21. The multi-band low noise amplifier of claim 1, wherein the output port of the output amplifier is coupled to a loading impedance, and the loading impedance comprises a resistor.

* * * * *